US008698237B2

(12) United States Patent
Tang

(10) Patent No.: US 8,698,237 B2
(45) Date of Patent: Apr. 15, 2014

(54) SUPERJUNCTION LDMOS AND MANUFACTURING METHOD OF THE SAME

(71) Applicant: Grace Semiconductor Manufacturing Corporation, Shanghai (CN)

(72) Inventor: Shushu Tang, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 13/631,844

(22) Filed: Sep. 28, 2012

(65) Prior Publication Data

US 2013/0082326 A1 Apr. 4, 2013

(30) Foreign Application Priority Data

Sep. 30, 2011 (CN) .......................... 2011 1 0298660

(51) Int. Cl.
*H01L 29/66* (2006.01)
(52) U.S. Cl.
USPC .................... 257/335; 257/E29.256; 438/400
(58) Field of Classification Search
USPC ........................... 257/335, E29.256; 438/400
See application file for complete search history.

(56) References Cited

U.S. PATENT DOCUMENTS

| 7,023,050 B2 * | 4/2006 | Salama et al. ................ 257/341 |
| 7,989,890 B2 * | 8/2011 | Huang et al. .................. 257/343 |
| 2012/0126323 A1 * | 5/2012 | Wu et al. ....................... 257/343 |

* cited by examiner

*Primary Examiner* — David Vu
*Assistant Examiner* — Brandon Fox
(74) *Attorney, Agent, or Firm* — Muncy, Geissler, Olds & Lowe, P.C.

(57) ABSTRACT

A superjunction LDMOS and its manufacturing method are disclosed. The superjunction LDMOS includes a diffused well in which a superjunction structure is formed; the superjunction structure has a depth less than the depth of the diffused well. The manufacturing method includes: provide a semiconductor substrate; form a diffused well in the semiconductor substrate by photolithography and high temperature diffusion; form an STI layer above the diffused well; form a superjunction structure in the diffused well by ion implantation, wherein the superjunction structure has a depth less than the depth of the diffused well; and form the other components of the superjunction LDMOS by subsequent conventional CMOS processes. The method is compatible with conventional CMOS processes and do not require high-cost and complicated special processes.

6 Claims, 3 Drawing Sheets 11 10

US 8,698,237 B2

SUPERJUNCTION LDMOS AND MANUFACTURING METHOD OF THE SAME

CROSS-REFERENCE TO RELATED APPLICATIONS

This application claims the priority of Chinese patent application number 201110298660.9, filed on Sep. 30, 2011, the entire contents of which are incorporated herein by reference.

TECHNICAL FIELD

The present invention relates to the field of power semiconductor devices, and more particularly, to a superjunction LDMOS and its manufacturing method.

BACKGROUND ART

Lateral double-diffused metal-oxide-semiconductor (LDMOS) is a commonly used power device. The performance of an LDMOS is generally assessed by its breakdown voltage and on-resistance, and it is desired to manufacture an LDMOS device with a high breakdown voltage and a low on-resistance. However, it is very difficult to achieve a high breakdown voltage and a low on-resistance at the same time, as the increase in the breakdown voltage will usually lead to an increase of the on-resistance, while the decrease in the breakdown voltage will usually lead to a reduction of the on-resistance. Compared with the structure of a MOS device, an LDMOS device has added a diffused well between the gate and the drain. Such a structure may greatly increase the breakdown voltage, but may also result in a relatively high on-resistance. In order to reduce the on-resistance, superjunction LDMOS devices have been proposed.

FIG. 1 is a schematic diagram illustrating the structure of an existing superjunction LDMOS device. As shown in FIG. 1, the superjunction LDMOS device has a drain drift region, which is composed of a diffused well 10 and a superjunction structure 11. The superjunction structure 11 is formed by alternatively arranged P-type regions and N-type regions. When a voltage is applied between a drain and a source of the superjunction LDMOS device, an electrical current will flow through the superjunction structure 11. As the P-type and N-type regions have the same shape and the electrical charges in the P-type and N-type regions are balanced, the on-resistance of the device can be greatly reduced.

With the increase of the breakdown voltage, the depth to width ratio of a superjunction structure 11 is required to be correspondingly increased. In ultra-high voltage devices, special processes, such as the process of forming stacked epitaxial layers, are needed to achieve a desired depth to width ratio of the superjunction structure 11, which may lead to asymmetries between the P-type and N-type regions and an increased manufacturing cost due to the extremely complicated processes.

SUMMARY OF THE INVENTION

An objective of the present invention is to provide a superjunction LDMOS and its manufacturing method to prevent the problems of the asymmetry of superjunction structure and the extremely complicated processes existing in the prior art, and especially in ultra-high voltage applications.

To achieve the above objective, the present invention provides a superjunction LDMOS and its manufacturing method, which is compatible with conventional CMOS processes and do not require any special processes. The LDMOS device and its manufacturing method can be applied to ultra-high voltage applications.

In the superjunction LDMOS of the present invention, a drain drift region includes a diffused well and a superjunction structure; the diffused well is a P-type well or an N-type well; the superjunction structure is formed in an upper part of the diffused well and has a depth less than a depth of the diffused well.

In the superjunction LDMOS of the present invention, the breakdown voltage of the device is greater than 700V, and a preferred depth to width ratio of the superjunction structure is less than 3. The superjunction structure can be manufactured by standard and mature CMOS processes without high-cost special processes, so that the manufacturing process is simplified and the manufacturing cost is reduced. By adopting the design of diffused well surrounding the superjunction structure, the influence of reduction in depth to width ratio of the superjunction structure to the on-resistance and the breakdown voltage can be effectively compensated.

The present invention further provides a method of manufacturing superjunction LDMOS, which includes: providing a semiconductor substrate; forming a diffused well in the semiconductor substrate by photolithography and high temperature diffusion; forming an STI layer above the drain drift region by photolithography and conventional CMOS processes; forming a superjunction structure under the STI by ion implantation, wherein the superjunction structure has a depth less than a depth of the diffused well; and forming the other components of the superjunction LDMOS by subsequent conventional CMOS processes.

In the abovementioned superjunction LDMOS, the semiconductor substrate may be a P-type substrate or an N-type substrate.

DETAILED DESCRIPTION

The present invention will be described and specified in combination with the accompanying drawings.

Figure 1:
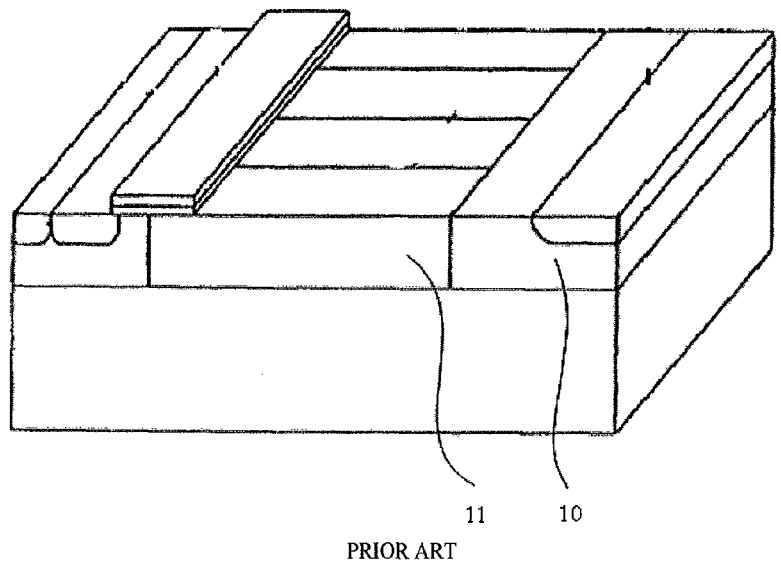
FIG. 1 is a schematic diagram of the structure of an existing superjunction LDMOS.
Figure 2:
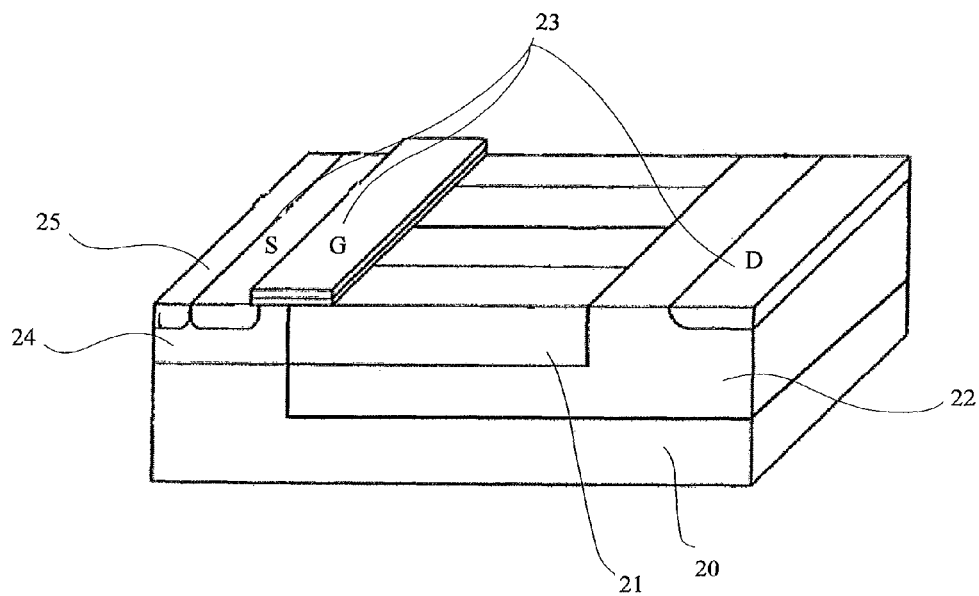
FIG. 2 is a schematic diagram of the structure of the superjunction LDMOS according to an embodiment of the present invention.

FIG. 2 is a schematic diagram of the structure of the superjunction LDMOS according to a first embodiment of the present invention. Compared with the superjunction structure of an existing superjunction LDMOS, the superjunction structure 21 of the superjunction LDMOS in this embodiment has a depth less than the depth of the diffused well 22, and the superjunction structure 21 is surrounded by the diffused well 22.

The superjunction LDMOS of this embodiment includes: a P-type substrate 20, an N-type diffused well 22 formed in the P-type substrate, as well as gate, source and drain regions 23. A drain drift region is formed by the diffused well 22 and the superjunction structure 21. The superjunction structure 21 is formed by P-type regions and N-type regions alternately arranged in pairs, wherein the P-type regions and the N-type regions are symmetrical. Preferably, the depth to width ratio of the superjunction structure 21 is less than 3.

The superjunction LDMOS further includes a P-well 24 formed in the P-type substrate. The source region S is formed in the P-well 24, and the P-well 24 is picked up by a pick-up terminal 25 formed on one side of the source region S.

The superjunction LDMOS further includes a shallow trench isolation (STI) layer formed on both sides of the gate electrode G, namely above the drain drift region and above the source region. In order to clearly demonstrate the top views of the superjunction structure 21, the N-type diffused well 22 and other components under the STI layer, the STI layer is omitted in FIG. 2. However, those skilled in the art shall understand that the STI layer should be included in the superjunction LDMOS.

FIG. 3 to FIG. 6 are schematic diagrams of the structure of the superjunction LDMOS in major steps of the manufacturing method according to the first embodiment of the present invention.

Figure 3:
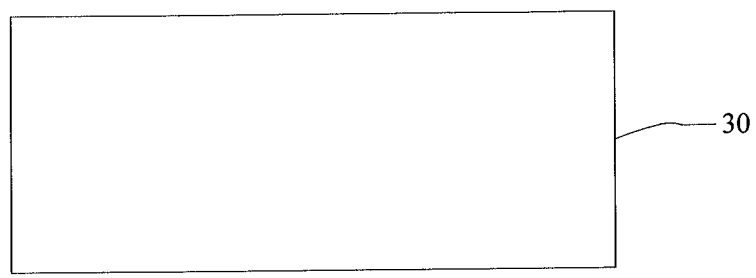
FIG. 3 to FIG. 6 are schematic diagrams of the structure of the superjunction LDMOS in the respective steps of the manufacturing method according to an embodiment of the present invention.

Referring to FIG. 3, provide a P-type substrate 30.

Figure 4:
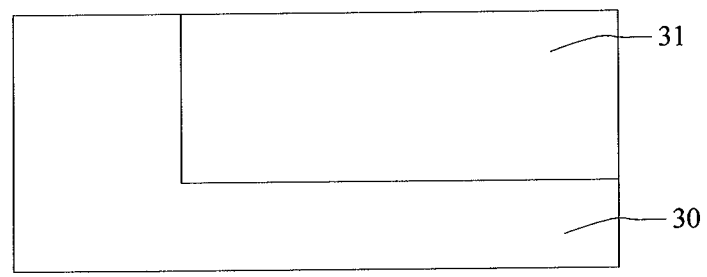

Referring to FIG. 4, form a diffused well 31 in the P-type substrate 30 by photolithography and high temperature diffusion processes, wherein the diffused well has a depth of greater than 5 µm.

Figure 5:
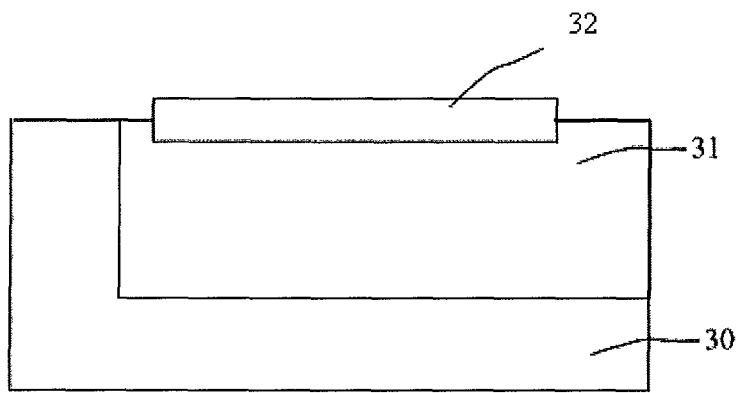

Referring to FIG. 5, form an STI layer 32 above the diffused well 31 by photolithography and conventional CMOS processes.

Figure 6:
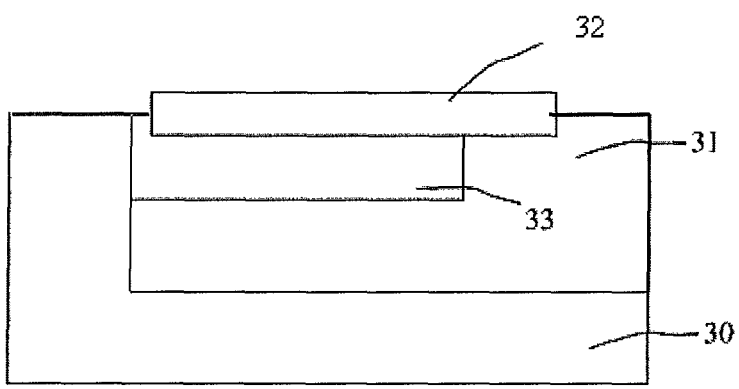

Referring to FIG. 6, form a superjunction structure 33 in the upper part of the diffused well 31 by ion implantation, wherein the depth of the superjunction structure 33 is less than that of the diffused well 31; the ion implantation process adopts an ion implantation concentration of $1E12/cm^2$ to $1E13/cm^2$.

Afterwards, finish the manufacturing of the superjunction LDMOS by performing subsequent conventional CMOS processes.

In a second embodiment of the present invention, a superjunction LDMOS and its manufacturing method are provided. Different from the first embodiment, the superjunction structure of the second embodiment includes an N-type substrate, a P-type diffused well and an N-well, or in other words, all the components of the LDMOS in the second embodiment have a reverse doping type compared with the first embodiment, namely all the P-types are replaced by N-types and N-types replaced by P-types. The structure and manufacturing method of the device will not be repeated herein.

The above embodiments are provided for the purpose of describing the invention and are not intended to limit the scope of the invention in any way. It will be apparent to those skilled in the art that various modifications and variations can be made without departing from the spirit or scope of the invention. Thus, it is intended that the present invention cover the modifications and variations of this invention.

I claim:

1. A superjunction LDMOS, comprising:
    a drain drift region, wherein the drain drift region comprises a diffused well; and
    a superjunction structure, the superjunction structure being formed in an upper part of the diffused well and having a depth less than a depth of the diffused well, wherein a depth to width ratio of the superjunction structure is smaller than 3.

2. The superjunction LDMOS according to claim 1, wherein the depth of the diffused well is greater than 5 µm.

3. The superjunction LDMOS according to claim 1, wherein a breakdown voltage of the superjunction LDMOS is greater than 700V.

4. A method of manufacturing the superjunction LDMOS according to claim 1, comprising the following steps:
    providing a semiconductor substrate;
    forming a diffused well in the semiconductor substrate by photolithography and high temperature diffusion processes;
    forming a shallow trench isolation layer above the diffused well; and
    forming a superjunction structure in the diffused well by ion implantation,
        wherein the superjunction structure has a depth less than a depth of the diffused well, wherein a depth to width ratio of the superjunction structure is smaller than 3.

5. The method according to claim 4, wherein the ion implantation process adopts an ion implantation concentration of $1E12/cm^2$ to $1E13/cm^2$.

6. The method according to claim 4, wherein the depth of the diffused well is greater than 5 µm.

* * * * *